(12) United States Patent
Dellmann et al.

(10) Patent No.: US 7,480,426 B1
(45) Date of Patent: Jan. 20, 2009

(54) METHOD OF FORMING A THREE-DIMENSIONAL STACKED OPTICAL DEVICE

(75) Inventors: Laurent Dellmann, Adliswil (CH); Michel Despont, Au (CH); Bert J. Offrein, Schoenenberg (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/054,754

(22) Filed: Mar. 25, 2008

(51) Int. Cl.
*G02B 6/12* (2006.01)
(52) U.S. Cl. ........................................ 385/14; 257/774
(58) Field of Classification Search ................... 385/14; 257/774
See application file for complete search history.

(56) References Cited

U.S. PATENT DOCUMENTS

| 7,215,032 | B2 | 5/2007 | Trezza | |
|---|---|---|---|---|
| 7,271,461 | B2 | 9/2007 | Dutta | |
| 7,335,972 | B2* | 2/2008 | Chanchani | 257/686 |
| 2005/0105860 | A1* | 5/2005 | Oono et al. | 385/88 |
| 2007/0194420 | A1* | 8/2007 | Feng | 257/678 |
| 2007/0222050 | A1 | 9/2007 | Lee et al. | |
| 2008/0099924 | A1* | 5/2008 | MacNamara et al. | 257/774 |
| 2008/0107375 | A1* | 5/2008 | Yonekura et al. | 385/14 |

\* cited by examiner

*Primary Examiner*—Ellen Kim
(74) *Attorney, Agent, or Firm*—Cantor Colburn LLP; Martin Toleti

(57) ABSTRACT

A method of forming a three-dimensional stacked optical device includes mounting at least one optical device to a transparent substrate, fabricating a plurality of vias though the at least one optical device, and filling the plurality of vias with a conductive material member that forms a plurality of backside contacts on the at least one optical device. The method further requires mounting an electronic chip to the plurality of backside contacts on the at least one optical device, fabricating a plurality of vias in the electronic chip, filling each of the plurality of vias in the electronic chip with a another conductive material member, and depositing a backside contact at each of the plurality of vias formed in the electronic chip. Each backside contact is electrically connected to corresponding ones of the another conductive material member positioned in respective ones of the plurality of vias formed in the electronic chip.

4 Claims, 4 Drawing Sheets

METHOD OF FORMING A THREE-DIMENSIONAL STACKED OPTICAL DEVICE

BACKGROUND OF THE INVENTION

1. Field of the Invention

This invention relates to the art of electronic devices and, more particularly, to a method of forming a three-dimensional stacked optical device.

2. Description of Background

Optical interconnect components are rapidly growing in popularity in the electronics industry. The need for higher communication bandwidth in newer electronic components is driving technology away from electrical communication busses. Electrical communication busses cannot meet increasing bandwidth requirements, predicted to exceed terabyte/second rates, foreseen for newer generation electrical devices. One technology currently being explored to meet the higher communication bandwidths is optical communication systems. However, even with the higher bandwidths afforded by optical communication systems, hundreds, up to more than a thousand, channels per processor module will be required to meet future communication needs. At present, existing optical packaging solutions present a challenge regarding assembly, cost and density to achieve a high number of channels. More specifically, current optical devices working at a standard wavelength of 850 nm emit and receive light on a side also provided with electrical contacts. Operational surfaces and contact on the same side limit packaging density and communication speeds.

SUMMARY OF THE INVENTION

The shortcomings of the prior art are overcome and additional advantages are provided through the provision of a method of forming a three-dimensional stacked optical device. The method includes mounting at least one optical device to a transparent substrate, fabricating a plurality of vias though the at least one optical device, and filling the plurality of vias with a conductive material member that forms a plurality of backside contacts on the at least one optical device. The method further requires mounting an electronic chip to the plurality of backside contacts on the at least one optical device, fabricating a plurality of vias in the electronic chip, filling the plurality of vias formed in the electronic chip with a another conductive material member, and depositing a backside contact at each of the plurality of vias formed in the electronic chip. Each backside contact is electrically connected to corresponding ones of the another conductive material member positioned in respective ones of the plurality of vias formed in the electronic chip.

Additional features and advantages are realized through the techniques of exemplary embodiments of the present invention. Other embodiments and aspects of the invention are described in detail herein and are considered a part of the claimed invention. For a better understanding of the invention with advantages and features thereof, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the exemplary embodiments of the invention, together with advantages and features, by way of example with reference to the drawings.

DETAILED DESCRIPTION OF THE INVENTION

Figure 1:
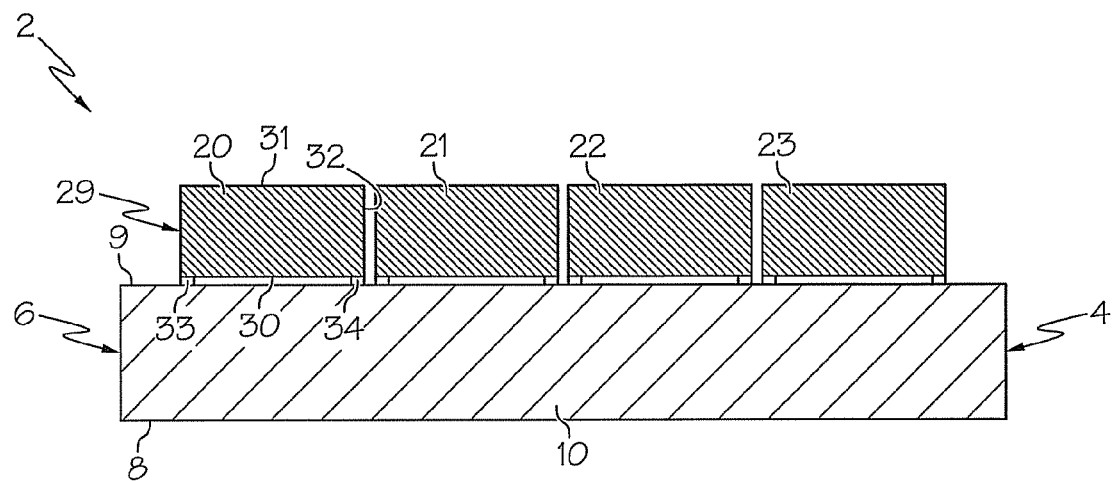
FIG. 1 illustrates an electronic device including optical devices constructed in accordance with exemplary embodiments of the present invention.

With initial reference to FIG. 1, an electronic device constructed in accordance with exemplary embodiments of the present invention is generally indicated at 2. As shown, electronic device 2 includes a transparent substrate 4 having a main body 6 including a first surface 8 that extends to a second surface 9 through an intermediate portion 10. At this point it should be understood that the term "transparent" includes both a clear or substantially clear material as well as openings or vias formed in a material, either transparent or opaque, that permit light to pass through the substrate.

Electronic device 2 also includes a plurality of optical devices 20-23, e.g., vertical cavity surface emitting laser (VCSEL) devices and photodiode (PD) devices, mounted to second surface 9 of substrate 4. However, it should be understood that the type of optical device employed can vary in accordance with exemplary embodiments of the present invention. In any event, as each optical device 20-23 includes similar packaging, a detailed description will be made referencing optical device 20 with an understanding that the remaining optical devices 21-23 include similar structure. As shown, optical device 20 includes a main body 29 having a first surface 30 that extends to a second surface 31 through an intermediate portion 32. Optical device 20 is mounted to second surface 9 of substrate 4 through a pair of mounting pads 33 and 34. Once mounted to substrate 4, each optical device 20-23 is thinned, i.e., processed or planarized to have a thickness of less than 20 μm so as to be suitable for further processing.

Figure 2:
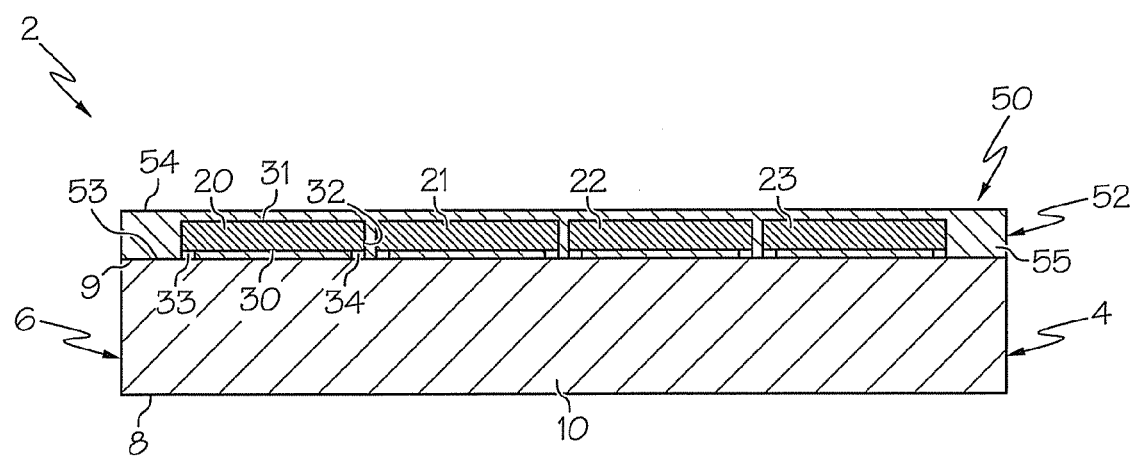
FIG. 2 illustrates the electronic device of FIG. 1 with the optical devices being thinned and embedded in an insulating material.

As best shown in FIG. 2, once thinned to a desired thickness, optical devices 20-23 are embedded in an insulating layer 50. Insulating layer 50 is employed as a gap filling material for a subsequent planarizing process. Insulating layer 50 is planarized to form a main body 52 having a first surface 53 that abuts second surface 9 of substrate 4 and extends to a second substantially planar surface 54 through an intermediate section 55. By being planarized, it should be understood that insulating layer 50 is processed such that second surface 54 is made substantially planar and intermediate section 55 is made to have a substantially uniform thickness.

Figure 3:
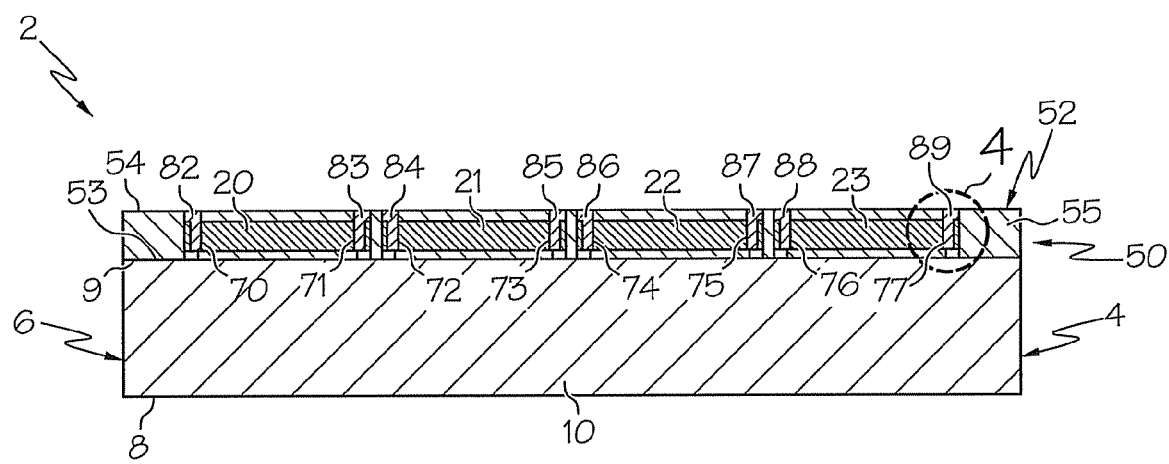
FIG. 3 illustrates the electronic device of FIG. 2 having a plurality of vias formed through the optical devices.
Figure 4:
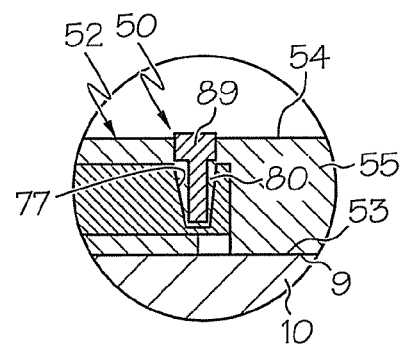
FIG. 4 is a detail view of one of the plurality of vias of FIG. 3.

At this point, a plurality of vias 70-77 are formed in optical devices 20-23 as shown in FIG. 3. Vias 70-77 extend from second surface 54 of insulating layer 50 toward contact pad region (not separately labeled) of optical device 20 and into respective ones of optical devices 20-23. Each via 70-77 includes a layer of isolating material 80, such as shown in connection with via 77 in FIG. 4, that electrically isolates each via 70-77 from a substrate (not separately labeled) of the corresponding optical device 20-23. Of course if the substrate of the corresponding optical device is not electrically conductive, isolating material 80 could be omitted. In addition to isolating layer 80, each via 70-77 is provided with a corresponding conductive material member 82-89, which, as will be discussed more fully below, creates a communication path through a backside, e.g., second surface 31, of each optical device 20-23.

Figure 5:
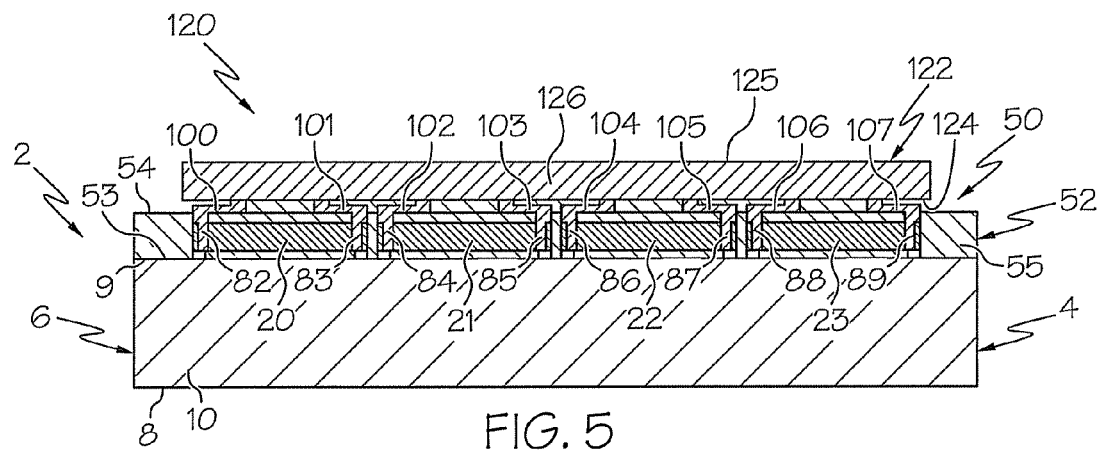
FIG. 5 illustrates the electronic device of FIG. 3 having an electronic component mounted to the optical devices through conductive material provided in the plurality of vias.
Figure 6:
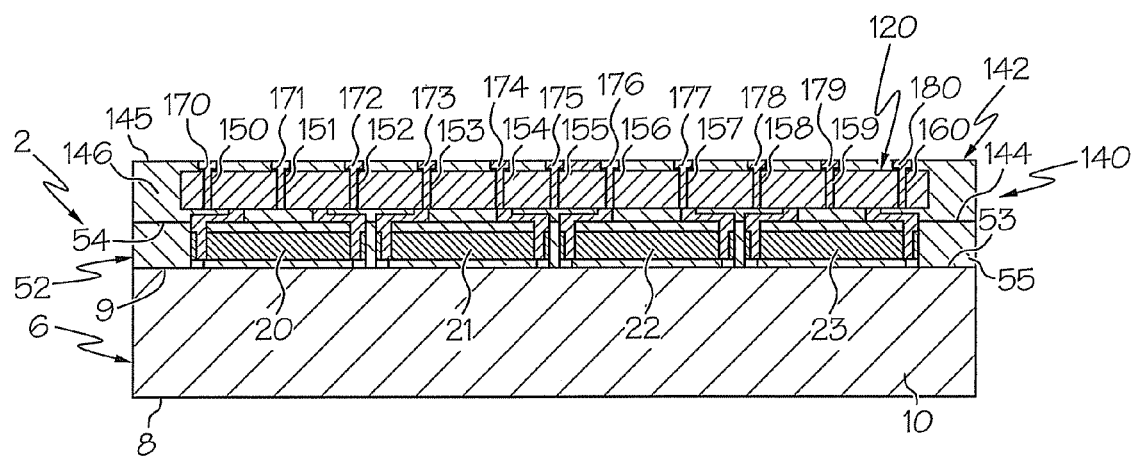
FIG. 6 illustrates the electronic device of FIG. 5 having a plurality of vias formed in the electronic component.

As best shown in FIG. 5, a plurality of backside contacts 100-107 are deposited on second surface 54 of insulating layer 50 and coupled with each conductive material member 82-89. Backside contacts 100-107 provide an electrical interface for an electronic component shown in the form of a driver and amplifier chip 120. Driver chip 120 includes a main body 122 having a first surface 124 that extends to a second surface 125 through an intermediate section 126. As illustrated in FIG. 6, first surface 124 is electrically coupled to backside contacts 100-107 and driver chip 120 is thinned or processed or planarized to a desired thickness that facilitates further processing. Once thinned to the desired thickness, driver chip 120 is embedded in an isolating layer 140. Isolating layer 140 includes a main body 142 having a first surface 144 that extends to a second surface 145 through an intermediate portion 146. In a manner similar to that described above, isolating layer 140 is planarized to facilitate further processing. At this point, a plurality of vias 150-160 are formed through second surface 145 and into driver chip 120.

Figure 7:
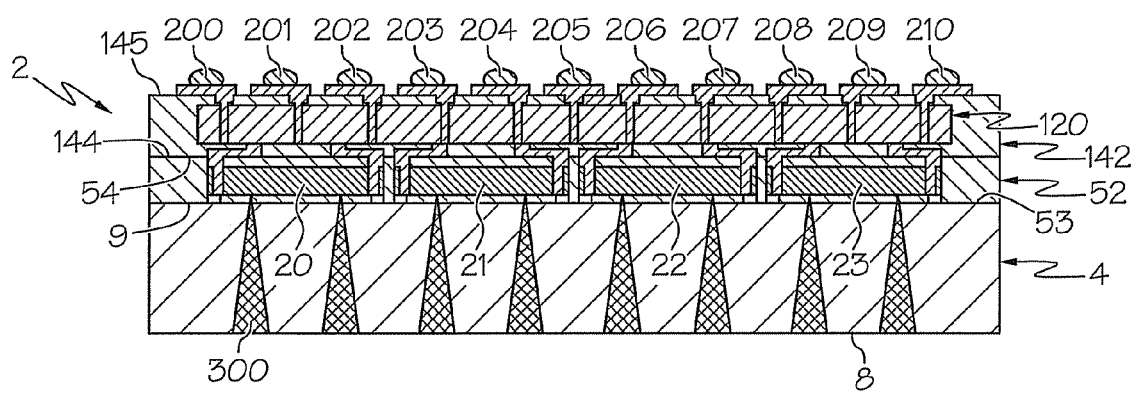
FIG. 7 illustrates the electronic device of FIG. 6 having a plurality of contacts electrically coupled to conductive material provided in each of the plurality of vias formed in the electronic component to establish a three-dimensional stacked optical device in accordance with exemplary embodiments of the present invention.

A corresponding plurality of conductive material members 170-180 are deposited in respective ones of vias 150-160. Conductive material members 170-180 provide a communication path between optical devices 20-23, driver chip 120 and external components (not shown). Towards that end, a plurality of backside contacts 200-210 are coupled to each of conductive material members 170-180 as shown in FIG. 7. With this arrangement, a stacked, three-dimensional optical component is formed allowing optical or light rays, such as indicated at 300, to pass through substrate 4 impinging upon optical devices 20-23 on one side while communication to external components passes from a second or backside of electronic device 2. In this manner, exemplary embodiments of the present invention provide an electronic component that is capable of communication speeds exceeding terabyte/second rates, while at the same time enabling the use of multiple components to provide sufficient channels of communication all while maintaining a minimal foot print.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method of forming a three-dimensional stacked optical device, the method comprising:
   mounting at least one optical device to a transparent substrate;
   fabricating a plurality of vias into the at least one optical device, the plurality of vias not extending into the transparent substrate;
   filling each of the plurality of vias formed in the at least one optical device with a conductive material member, the conductive material member forming a plurality of backside contacts on the at least one optical device;
   mounting an electronic chip to the plurality of backside contacts on the at least one optical device;
   fabricating a plurality of vias in the electronic chip;
   filling each of the plurality of vias formed in the electronic chip with a another conductive material member; and
   depositing a backside contact at each of the plurality of vias formed in the electronic chip, the backside contact being electrically connected to the another conductive material member positioned in respective ones of the plurality of vias formed in the electronic chip.

2. The method of claim 1, further comprising: planarizing each of the at least one optical device and the electronic chip.

3. The method of claim 1, further comprising: embedding the at least one optical device in an insulating layer.

4. The method of claim 1, further comprising: embedding the electronic chip in an isolating layer, the back side contact deposited at each of the plurality of vias formed in the electronic chip resting upon an outer surface of the isolating layer.

* * * * *